(12) United States Patent
Morita et al.

(10) Patent No.: US 8,529,701 B2
(45) Date of Patent: Sep. 10, 2013

(54) SUBSTRATE PROCESSING APPARATUS

(75) Inventors: Shinya Morita, Toyama (JP); Takayuki Nakada, Toyama (JP); Tomoyuki Matsuda, Toyama (JP); Keisuke Sakashita, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 500 days.

(21) Appl. No.: 12/537,017

(22) Filed: Aug. 6, 2009

(65) Prior Publication Data

US 2010/0050945 A1 Mar. 4, 2010

(30) Foreign Application Priority Data

Aug. 28, 2008 (JP) .................................. 2008-219724

(51) Int. Cl.
| | |
|---|---|
| C23C 16/455 | (2006.01) |
| H01L 21/306 | (2006.01) |
| C23F 1/00 | (2006.01) |
| C23C 16/06 | (2006.01) |

(52) U.S. Cl.
USPC ...................... 118/733; 118/715; 156/345.33

(58) Field of Classification Search
USPC .............................. 118/733, 715; 156/345.33
See application file for complete search history.

(56) References Cited

U.S. PATENT DOCUMENTS

| | | | | |
|---|---|---|---|---|
| 4,539,933 A | * | 9/1985 | Campbell et al. ............. | 118/719 |
| 5,207,573 A | * | 5/1993 | Miyagi et al. .................. | 432/182 |
| 5,370,371 A | * | 12/1994 | Miyagi et al. .................. | 266/256 |
| 5,578,132 A | * | 11/1996 | Yamaga et al. ................ | 118/724 |
| 5,750,436 A | * | 5/1998 | Yamaga et al. ................ | 438/558 |
| 5,908,292 A | * | 6/1999 | Smith et al. .................... | 432/197 |
| 5,994,675 A | * | 11/1999 | Bethune et al. ................ | 219/483 |
| 6,142,773 A | * | 11/2000 | Shimazu ........................ | 432/241 |
| 6,187,102 B1 | * | 2/2001 | Yamamoto .................... | 118/725 |
| 6,407,367 B1 | * | 6/2002 | Ito et al. ......................... | 219/390 |
| 6,482,753 B1 | * | 11/2002 | Tometsuka .................... | 438/758 |
| 6,712,909 B2 | * | 3/2004 | Tometsuka .................... | 118/725 |
| 7,674,336 B2 | * | 3/2010 | Honma et al. ................. | 118/715 |
| 8,043,431 B2 | * | 10/2011 | Ozaki et al. ................... | 118/715 |

(Continued)

FOREIGN PATENT DOCUMENTS

| | | |
|---|---|---|
| JP | 03054821 | 3/1991 |
| JP | 04264716 | 9/1992 |

(Continued)

OTHER PUBLICATIONS

Machine Translation of JP-2005209813.*

*Primary Examiner* — Rudy Zervigon
(74) *Attorney, Agent, or Firm* — Brundidge & Stanger, P.C.

(57) ABSTRACT

A substrate processing apparatus includes a reaction tube, the reaction tub including an inner tube made of quartz and an outer tube made of quartz; a manifold made of quartz disposed under the outer tube, a top surface of the manifold being in air-tight contact with a bottom surface of the outer tube via a sealing member; a seal cap cover made of quartz disposed under the manifold, a top surface of the seal cap cover being in air-tight contact with a bottom surface of the manifold via a sealing member; a seal cap covered by the seal cap cover, a top surface of the seal cap being in air-tight contact with a bottom surface of the seal cap cover via a sealing member; and at least one protrusion disposed at the bottom surface of one of the outer tube, the manifold, the seal cap cover, and combinations thereof.

8 Claims, 9 Drawing Sheets

(56) References Cited

U.S. PATENT DOCUMENTS

| | | | |
|---|---|---|---|
| 8,057,599 B2 * | 11/2011 | Ozaki et al. | 118/715 |
| 8,076,615 B2 * | 12/2011 | Morita et al. | 219/390 |
| 2002/0168854 A1 * | 11/2002 | Tometsuka | 438/680 |
| 2003/0015138 A1 * | 1/2003 | Tometsuka | 118/715 |
| 2006/0150904 A1 * | 7/2006 | Ozaki et al. | 118/715 |
| 2009/0188431 A1 * | 7/2009 | Ozaki et al. | 118/719 |
| 2009/0197409 A1 * | 8/2009 | Morita et al. | 438/680 |
| 2009/0308315 A1 * | 12/2009 | De Ridder | 118/715 |
| 2010/0050945 A1 * | 3/2010 | Morita et al. | 118/733 |

FOREIGN PATENT DOCUMENTS

| | | | |
|---|---|---|---|
| JP | 07058048 | | 3/1995 |
| JP | 07106264 | | 4/1995 |
| JP | 09082656 A | * | 3/1997 |
| JP | 2002-334868 | | 11/2002 |
| JP | 2005209813 A | * | 8/2005 |

* cited by examiner

SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2008-219724, filed on Aug. 28, 2008, in the Japanese Patent Office, the entire contents of which are hereby incorporated by reference.

BACKGROUND OF THE INVENTION

1. Field of the Invention

The present invention relates to a substrate processing apparatus.

For example, the present invention may be effectively applied to a heat treatment apparatus (furnace) configured to perform a heat treatment process, such as film forming, annealing, oxidation, diffusion, and reflow treatment for carrier activation or planarization after ion implantation, so as to form an oxide film, a metal film, or a semiconductor film on a semiconductor wafer (hereinafter, referred to as a wafer) for forming a semiconductor integrated circuit device (hereinafter, referred to as an IC) on the wafer.

2. Description of the Prior Art

In a method of manufacturing an IC, a heat treatment apparatus such as a batch type vertical hot-wall chemical vapor deposition (CVD) apparatus is widely used to deposit a material such as silicon nitride ($Si_3N_4$), silicon oxide ($SiO_x$), and polysilicon on a wafer.

The batch type vertical hot-wall CVD apparatus (hereinafter, referred to as a CVD apparatus) includes: an outer tube; an inner tube installed inside the outer tube to form a process chamber; a heating device (heater) configured to heat the inside of the outer tube; a manifold on which the outer and inner tubes are placed and to which an exhaust pipe and a gas introducing pipe are connected for exhausting the process chamber and supplying gas to the process chamber; and a boat configured to hold a plurality of vertically arranged wafers and be loaded into the process chamber.

When the boat in which a plurality of wafers are held is loaded into the process chamber through a lower furnace port, a film-forming gas is supplied to the process chamber through the gas introducing pipe, and at the same time, the process chamber is heated by the heating device, so that CVD films can be deposited on the wafers.

Such a CVD apparatus of the related art, for example, a CVD apparatus disclosed in Patent Document 1, includes a manifold (furnace port flange) made of a metal.

Since the metallic manifold has a thin plate thickness and low heat capacity, heat can be easily dissipated to the outside of a furnace port.

[Patent Document 1] Japanese Unexamined Patent Application Publication No. 2002-334868

However, such a CVD apparatus including a metallic manifold has a problem in that the metallic manifold is corroded by reaction products, which are generated from reaction gas and cleaning gas and attached to the metallic manifold.

Moreover, as the size of ICs reduces, metal emission from the metallic manifold of the CVD apparatus causes other problems. Therefore, recent manifolds, outer tubes, and seal caps are made of quartz.

In a semiconductor manufacturing apparatus, a vacuum seal part corresponding to an O-ring is provided at a flange part of a quartz outer tube or the like, and if the seal surface (joining surface) of the vacuum seal part is damaged (or scratched), there may be a problem such as leakage of process gas. A part such as the outer tube has a seal surface at its bottom surface, and if the outer tube is detached from the semiconductor manufacturing apparatus and stored or temporarily placed on a floor, the seal surface of the outer tube can be damaged due to contaminants although the floor is covered with a clean sheet.

Moreover, in some cases, a flange of an exhaust pipe of the outer tube may be installed at a position lower than the bottom surface of the outer tube. In this case, the weight of the outer tube can be directly applied to the flange of the exhaust pipe, and thus the exhaust pipe can be broken.

Furthermore, in the case where a quartz part is placed on a floor, contaminants can be attached from a floor to the seal surface of the quartz part, and the contaminants may enter into a furnace to pollute the inside of the furnace.

SUMMARY OF THE INVENTION

An object of the present invention is to provide a substrate processing apparatus configured so that when a quartz part is placed on a floor, an O-ring seal surface can be protected, application of a weight to an exhaust pipe can be prevented, the possibility of damages of the quartz part and breakage of the exhaust pipe can be reduced, and permeation of contaminants from a floor into a furnace during a maintenance work can be prevented.

According to an aspect of the present invention, there is provided a substrate processing apparatus including: a reaction tube including an inner tube and an outer tube; a manifold disposed under the outer tube, a top surface of the manifold being in air-tight contact with a bottom surface of the outer tube via a sealing member; a seal cap cover disposed under the manifold, a top surface of the seal cap cover being in air-tight contact with a bottom surface of the manifold via a sealing member; a seal cap covered by the seal cap cover, a top surface of the seal cap being in air-tight contact with a bottom surface of the seal cap cover via a sealing member; and at least one protrusion disposed at one of the bottom surface of the outer tube, the bottom surface of the manifold, the bottom surface of the seal cap cover and combinations thereof, wherein the protrusion at the bottom surface of the outer tube is disposed outside the sealing member between the top surface of the manifold and the bottom surface of the outer tube, the protrusion at the bottom surface of the manifold is disposed outside the sealing member between the to surface of the seal cap cover and the bottom surface of the manifold, and the protrusion at the bottom surface of seal cap cover is disposed outside the sealing member between the top surface of the seal cap and the bottom surface of the seal cap cover.

DETAILED DESCRIPTION OF THE PREFERRED EMBODIMENTS

Hereinafter, an embodiment of the present invention will be described with reference to the attached drawings.

In the current embodiment, a substrate processing apparatus of the present invention is configured by a CVD apparatus (batch type vertical hot-wall CVD apparatus) adapted to perform a film-forming operation in an IC manufacturing process.

Figure 1:
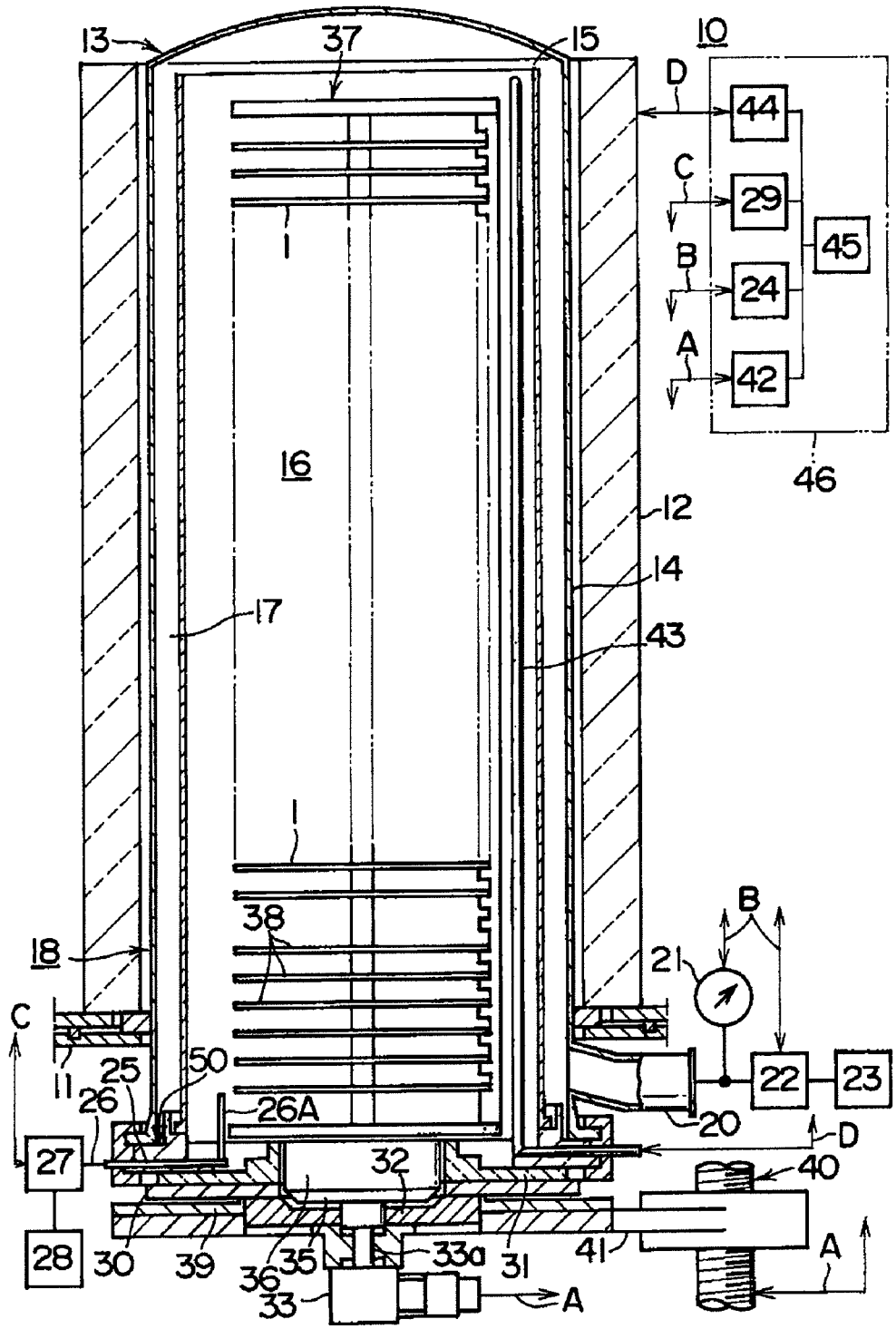
FIG. 1 is a vertical sectional view illustrating a chemical vapor deposition (CVD) apparatus of the related art.

As shown in FIG. 1, a CVD apparatus 10 includes a heater 12 as a heating device.

The heater 12 has a cylindrical shape and is vertically installed in a manner such that the heater 12 is supported on a heater base 11 used as a holding plate.

At the inside of the heater 12, a process tube 13 is installed coaxially with the heater 12 as a reaction tube. The process tube 13 includes an outer tube 14 used as an outer reaction tube and an inner tube 15 used as an inner reaction tube.

The outer tube 14 is made of quartz ($SiO_2$) and has a cylindrical shape with an inner diameter greater than the outer diameter of the inner tube 15. The outer tube 14 has a closed top end and an opened bottom end.

The inner tube 15 is made of a material such as quartz ($SiO_2$) and has a cylindrical shape with opened top and bottom ends. A hollow portion of the inner tube 15 forms a process chamber 16. The process chamber 16 is configured to accommodate a boat 37 (described later) in which wafers 1 are horizontally positioned and vertically arranged in multiple stages.

The outer tube 14 and the inner tube 15 are coaxially installed. A cylindrical space 17 is formed between the outer tube 14 and the inner tube 15.

At the lower side of the outer tube 14, a manifold 50 (described later) is installed coaxially with the outer tube 14. The outer tube 14 and the inner tube 15 are placed on the manifold 50. The process tube 13 and the manifold 50 constitute a process vessel 18.

The outer tube 14 is connected to an exhaust pipe 20, which is used to exhaust the inside atmosphere of the process tube 13. The exhaust pipe 20 is disposed at a lower end portion of the cylindrical space 17 and communicates with the cylindrical space 17.

To the downstream side of the exhaust pipe 20 opposite to the outer tube 14, an exhaust device 23 such as a vacuum pump is connected through a pressure sensor 21 used as a pressure detector and a pressure adjusting device 22. The exhaust device 23 exhausts the process chamber 16 to a predetermined pressure (vacuum degree).

A pressure control unit 24 is electrically connected to the pressure sensor 21 and the pressure adjusting device 22 through electric lines B. The pressure control unit 24 controls the pressure adjusting device 22 based on pressure information detected by the pressure sensor 21 so as to adjust the inside pressure of the process chamber 16 to a predetermined level at a desired time.

Figure 2:
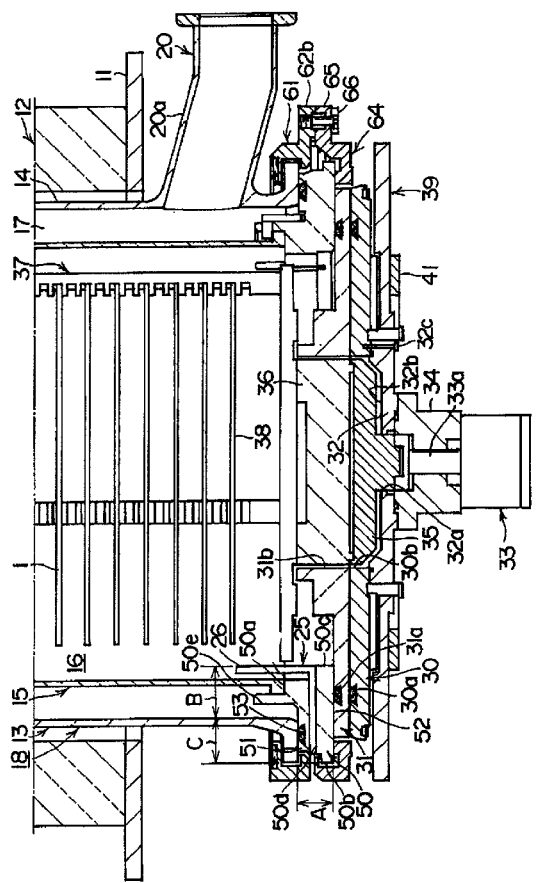
FIG. 2 is a vertical section view illustrating characteristic parts of a process chamber of the related art.

The exhaust pipe 20 includes a slope part 20a (refer to FIG. 2). The slope part 20a is inclined from the heater base 11 to an outer tube receiving part 61 (refer to FIG. 2). Since the exhaust pipe 20 includes the slope part 20a, an area of the process vessel 18 excluding a heating area can have a small height.

On the contrary, if the area of the process vessel 18 excluding the heating area has a large height, the height of the boat 37 should be high to place wafers in the heating area formed by the heater 12. Moreover, if the height of the boat 37 is high, the height of a waiting chamber (preliminary chamber) located under the process vessel 18 should be accordingly high. Therefore, in the case where the area of the process vessel 18 excluding the heating area has a large height, the overall height of the CVD apparatus 10 is also increased by about two times the height of the area of the process vessel 18 excluding the heating area.

In the current embodiment, the height of the process vessel 18 excluding the heating area can be reduced owing to the slope part 20a of the exhaust pipe 20, and thus, the overall height of the CVD apparatus 10 can be reduced by about two times the reduced height.

A gas supply unit 25 is installed at the process vessel 18 and communicates with the process chamber 16. A gas supply pipe 26 is connected to the gas supply unit 25.

The upstream side of the gas supply pipe 26 opposite to the gas supply unit 25 is connected to a mass flow controller (MFC) 27 used as a gas flow rate controller, and the MFC 27 is connected to a gas supply source 28. The gas supply source 28 supplies process gas or inert gas.

A gas flow rate control unit 29 is electrically connected to the MFC 27 through an electric line C. The gas flow rate control unit 29 controls the MFC 27 such that a desired rate of gas can be supplied at a desired time.

At the lower side of the process vessel 18, a seal cap 30 is installed. The seal cap 30 constitutes a cover part for airtightly closing an opened bottom end of the process chamber 16. For example, the seal cap 30 is made of quartz or a metallic material such as stainless steel or nickel alloy, and the seal cap 30 has a disk shape.

At the side of the seal cap 30 facing the process chamber 16, a seal cap cover 31 is installed. For example, the seal cap cover 31 is made of a nonmetallic material such as quartz. The seal cap cover 31 covers the seal cap 30 so that the metallic seal cap 30 is not exposed to the process chamber 16.

The seal cap cover 31 is configured to be brought into contact with the bottom surface of the process vessel 18 in a vertical direction from the downside.

As shown in FIG. 2, at the top surface of the seal cap 30, an O-ring 30a is installed. The O-ring 30a makes contact with the bottom surface of the seal cap cover 31 as a sealing member.

At the top surface of the seal cap cover 31, another O-ring 31a is installed. The O-ring 31a makes contact with the bottom surface of the process vessel 18 as a sealing member.

At the center part of the seal cap 30, a circular hole 30b is formed, and at the center part of the seal cap cover 31, another circular hole 31b is formed. The circular hole 30b of the seal cap 30 and the circular hole 31b of the seal cap cover 31 are overlapped with each other.

At the (bottom) side of the seal cap 30 opposite to the seal cap cover 31, a flange 32 is installed. The flange 32 has an outer diameter larger than the diameter of the circular hole 30b. The flange 32 is fixed to the bottom side of the seal cap 30 using an attaching screw 32c. At the center part of the flange 32, an insertion hole 32a is formed. At the top surface of the flange 32, a recess 32b is formed concentric to the insertion hole 32a. The recess 32b has a diameter greater than the diameter of the insertion hole 32a but smaller than the diameter of the circular hole 30b of the seal cap 30 and the diameter of the circular hole 31b of the seal cap cover 31.

At the bottom center part of the flange 32, a rotation mechanism 33 is installed via a bearing 34. At the upper end of a rotation shaft 33a of the rotation mechanism 33, a boat receiving part 35 is installed in a manner such that the boat receiving part 35 is rotatable together with the rotation shaft 33a. For example, the boat receiving part 35 is made of a metal such as stainless or nickel alloy and has a two-step cylinder shape with a relatively large diameter at an upper part and a small diameter at a lower part. The boat receiving part 35 is inserted at an interior region defined by the insertion hole 32a of the flange 32, the recess 32b of the flange 32, and the circular hole 30b of the seal cap 30.

A pedestal 36 is placed on the boat receiving part 35 in a manner such that the pedestal 36 can be rotated together with the boat receiving part 35 and the rotation shaft 33a. The pedestal 36 is made of a material such as alumina ceramic, transparent quartz, or opaque quartz and has a cylindrical shape. The pedestal 36 is rotatably inserted in the circular hole 31b of the seal cap cover 31. The boat 37 is placed above the pedestal 36 in a manner such that the boat 37 can be rotated together with the pedestal 36, the boat receiving part 35, and the rotation shaft 33a.

The boat 37 is used as a substrate holder and is made of a heat resistant material such as quartz or silicon carbide. The boat 37 is configured to hold a plurality of wafers 1 in a manner such that the wafers 1 are horizontally positioned and arranged in multiple stages with centers of the wafers 1 being aligned.

At the lower part of the boat 37, a plurality of insulating plates 38 are horizontally disposed in multiple stages as insulating members. For example, the insulating plates 38 are made of a heat resistant material such as quartz or silicon carbide and have a disk shape. The insulating plates 38 suppress heat transfer from the heater 12 to the seal cap 30.

As shown in FIG. 1, a base 39 is vertically supported by an arm 41 of a boat elevator 40.

The boat elevator 40 is vertically installed outside the process tube 13. The boat elevator 40 is an elevating mechanism configured to move the boat 37 upward and downward in a vertical direction. That is, the boat elevator 40 is used to load the boat 37 into the process chamber 16 and unload the boat 37 from the process chamber 16.

A driving control unit 42 is electrically connected to the rotation mechanism 33 and the boat elevator 40 through electric lines A. The driving control unit 42 controls the rotation mechanism 33 and the boat elevator 40 so that desired operations of the rotation mechanism 33 and the boat elevator 40 can be performed at desired times.

At the inside of the process tube 13, a temperature sensor 43 is installed as a temperature detector.

A temperature control unit 44 is electrically connected to the heater 12 and the temperature sensor 43 through electric lines D. The temperature control unit 44 controls power supplied to the heater 12 based on temperature information detected by the temperature sensor 43 so that desired temperature distribution can be obtained at the inside of the process chamber 16 at a desired time.

The pressure control unit 24, the gas flow rate control unit 29, the driving control unit 42, and the temperature control unit 44 constitute a manipulation part and an input/output part, and are electrically connected to a main control unit 45 that controls the overall operation of the CVD apparatus 10.

A controller 46 is configured by the pressure control unit 24, the gas flow rate control unit 29, the driving control unit 42, the temperature control unit 44, and the main control unit 45.

Figure 3:
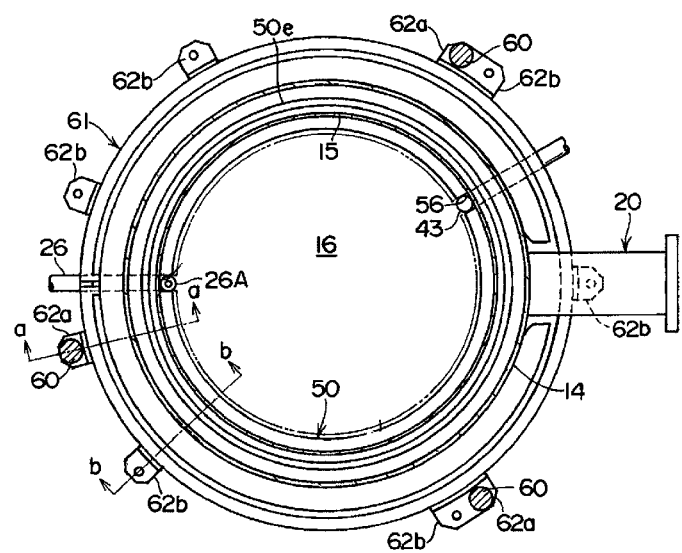
FIG. 3 is a horizontal sectional view illustrating characteristic parts of the process chamber of the related art.

The manifold 50 is made of a nonmetallic material such as quartz and has a circular-ring, flat-block shape (refer to FIG. 3). The manifold 50 is transparent or semitransparent. The manifold 50 includes a protrusion part 50a that protrudes inward more than the inner circumferential surface of the outer tube 14.

In addition, as shown in FIG. 2, the gas supply unit 25 is formed at the manifold 50 by a penetration hole 50d formed from an outer wall 50b to an inner wall 50c of the protrusion part 50a, and a nozzle 26A inserted through the penetration hole 50d.

As explained above, since the manifold 50 is made of a nonmetallic material such as quartz, the manifold 50 does not produce corrosive metallic contaminants even when gas corrosive to a metal part is supplied to the inside of the process vessel 18 or the inside of the process vessel 18 is dry-cleaned with etching gas.

The manifold 50 has a circular-ring and flat-block shape, and particularly, the manifold 50 includes the protrusion part 50a so that the manifold 50 can have a large area for receiving heat rays directly from the heater 12.

Therefore, the manifold 50 can receive radiant heat easily, and heat can be easily transferred across the manifold 50 because the manifold 50 has a low thermal capacity owing to its thin thickness.

Thus, byproducts are not easily adhered to the surface of the manifold 50.

In addition, gas such as gas supplied through the gas supply unit 25 is preheated at the manifold 50.

On a first joining surface 51 of the manifold 50, an O-ring 53 is installed. The O-ring 53 is a sealing member making contact with the bottom surface of the outer tube 14.

Figure 5:
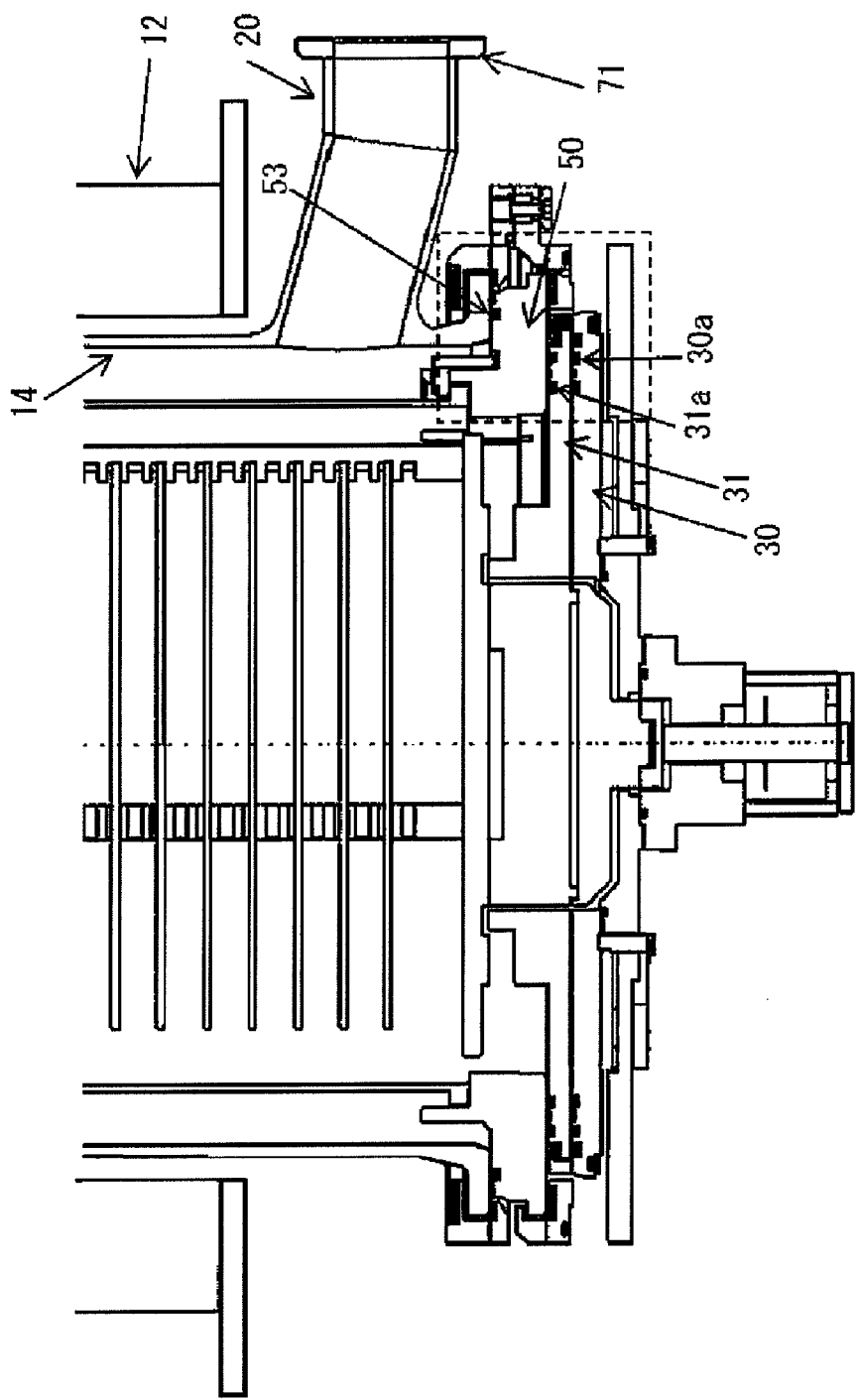
FIG. 5 is a schematic view illustrating the process chamber of the related art.

FIG. 5 is a schematic view illustrating the process chamber. As shown in FIG. 5, a seal surface corresponding to an O-ring is provided at a flange part of the outer tube 14 made of quartz, and, for example, if the seal surface (joining surface) is damaged, there may be a problem such as leakage of process gas. A part such as the outer tube 14 has a seal surface at its bottom surface, and if the outer tube is stored or temporarily placed on a floor, the seal surface of the outer tube can be damaged due to contaminants although the floor is covered with a clean sheet.

Moreover, in some cases, a flange of the exhaust pipe 20 of the outer tube 14 may be installed at a position lower than the bottom surface of the outer tube 14. In this case, the weight of the outer tube is applied to the flange of the exhaust pipe 20, and thus the exhaust pipe can be broken. Furthermore, in the case where a quartz part is placed on a floor, contaminants can be attached from a floor to the quartz part and enter into a furnace to pollute the inside of the furnace.

Figure 6:
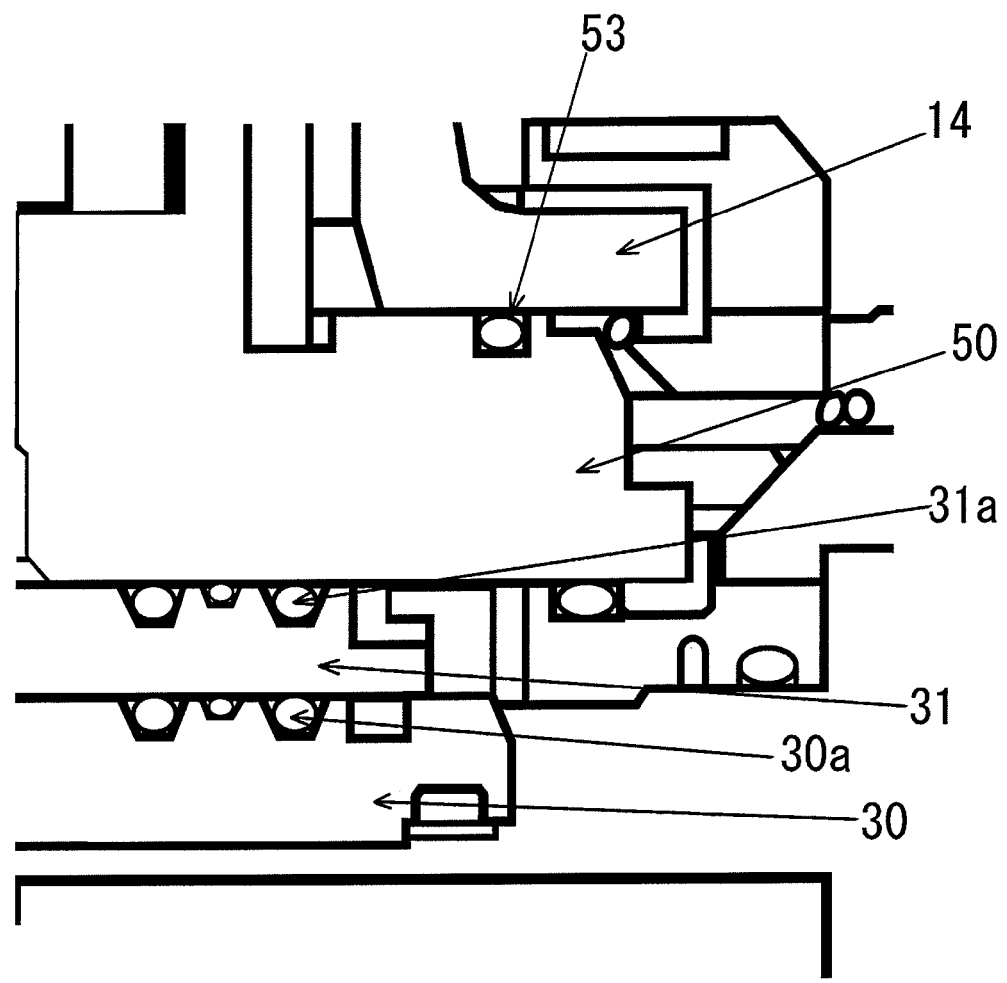
FIG. 6 is an enlarge view of a dashed portion of FIG. 5, illustrating a seal surface of the related art.
Figure 7:
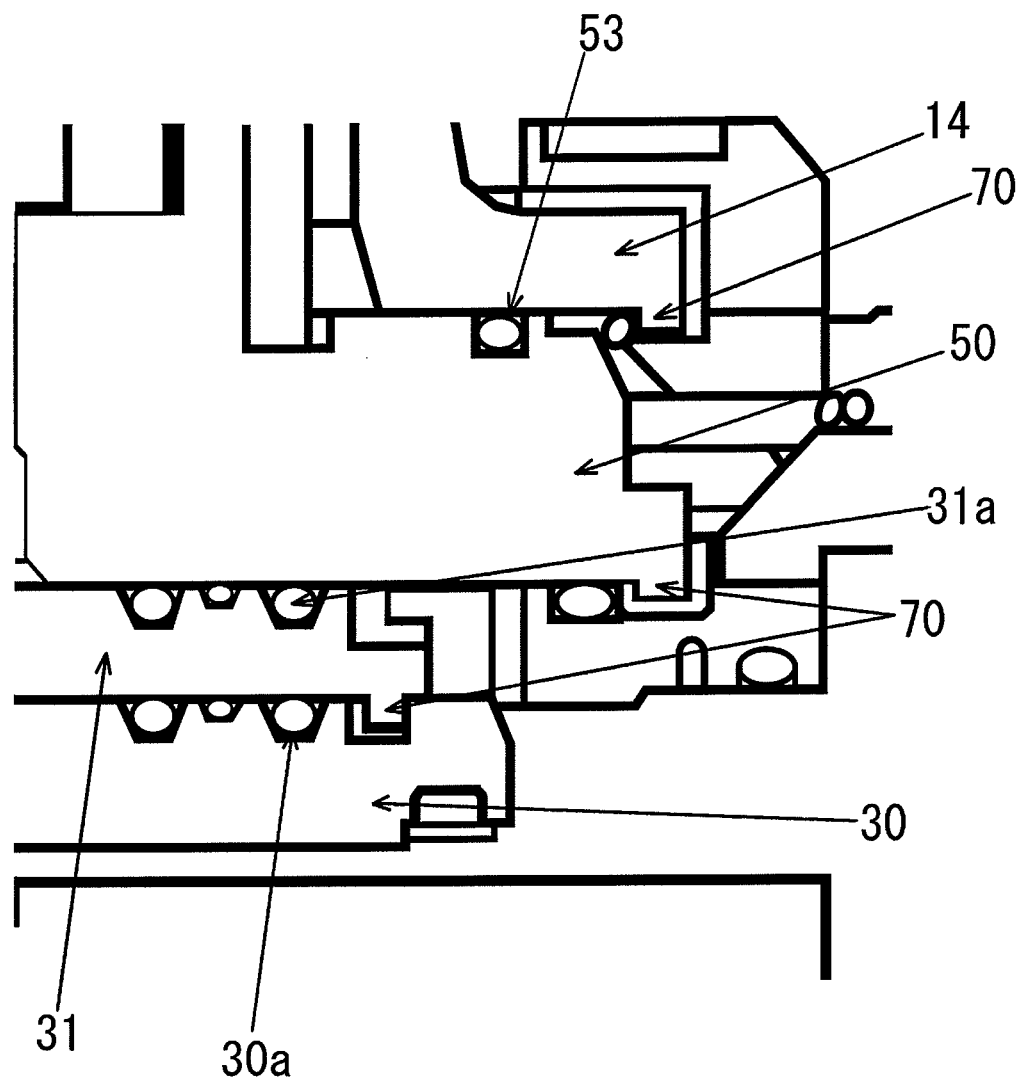
FIG. 7 is a view corresponding to FIG. 6 and illustrating a seal surface according to the present invention.
Figure 8:
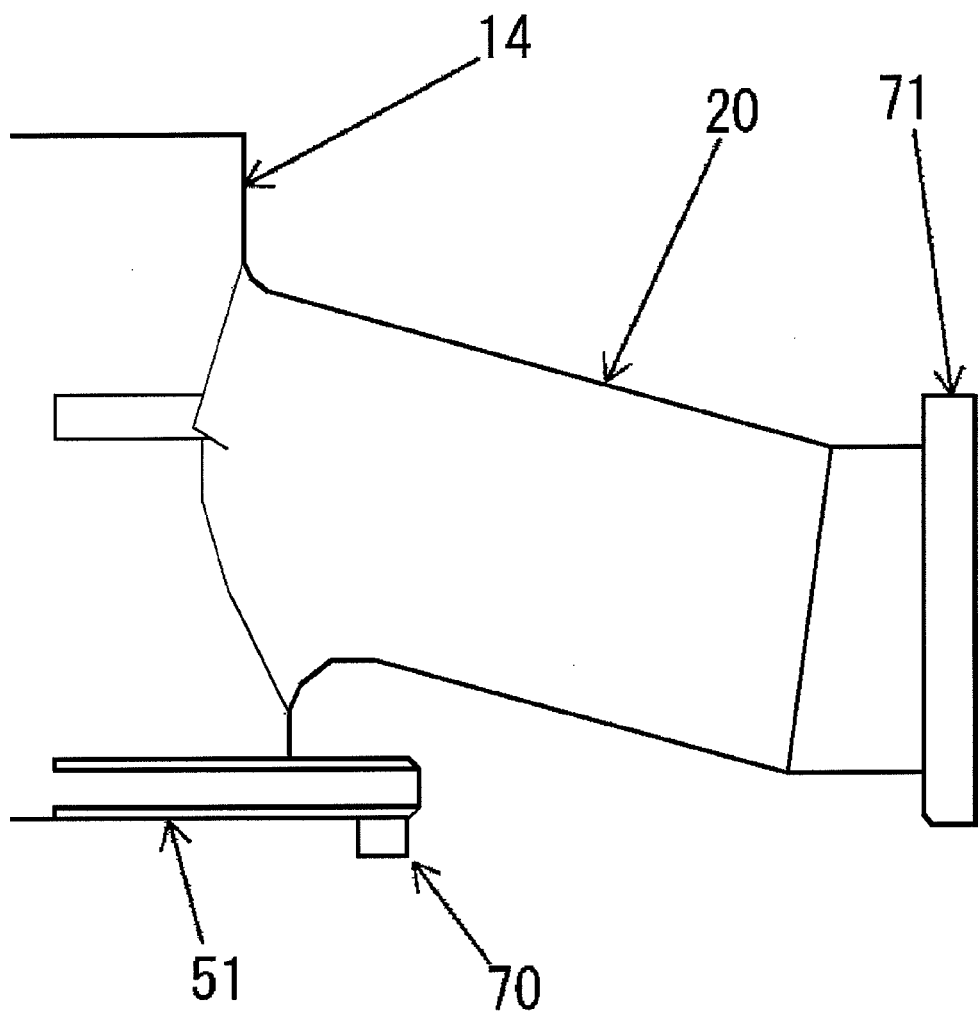
FIG. 8 is a view illustrating a positional relationship between an exhaust pipe and a protrusion formed at a seal surface according to the present invention.

In the case where the outer tube 14, the manifold 50, the seal cap 30 have O-ring seal surfaces at their bottom surfaces, the O-ring seal surfaces can be damaged if the outer tube 14, the manifold 50, and the seal cap 30 are placed on a floor. FIG. 6 is an enlarge view of a dashed portion of FIG. 5, illustrating a seal surface of the related art. FIG. 7 is a view illustrating a structure of the present invention, which corresponds to FIG. 6. Referring to FIG. 7 and FIG. 8, a protrusion 70 having a block or ring shape and made of quartz is disposed on an O-ring seal surface (joining surface) of the bottom surface of an outer tube 14, and thus the O-ring surface of the outer tube 14 is not directly brought into contact with a floor when the outer tube 14 is placed on the floor. Since the block or ring shaped protrusion 70 is located at a position outside an O-ring seal, the O-ring seal surface can be prevented from being damaged, and thus, although contaminants of the floor are attached to a contact surface (the quartz protrusion 70) that makes contact with floor, the contaminants cannot enter into a furnace because the contact surface is located outside the O-ring seal.

As shown in FIG. 8 with a dashed line, in some cases, a flange 71 of an exhaust pipe 20 of the outer tube 14 may be installed at a position lower than the bottom surface of the outer tube 14. For this case, the block or ring shaped quartz protrusion 70 disposed on the bottom surface of the outer tube 14 may be configured to have a predetermined height, so that the protrusion 70, not the flange 71 of the exhaust pipe 20, can be the lowermost bottom surface of the outer tube 14. In this case, when the outer tube 14 is placed on a floor, although the flange 71 of the exhaust pipe 20 is lower than an O-ring seal surface 51, the protrusion 70 makes contact with the floor. Therefore, the weight of the outer tube 14 is applied to the flange 71 of the exhaust pipe 20, and thus the outer tube 14 can be safely placed on the floor. In addition, the protrusion 70 can be configured by a plurality of blocks disposed on the O-ring seal surface (joining surface) 51 so as to protect the O-ring seal surface 51 when the outer tube 14 is placed on a floor. Alternatively, the protrusion 70 may be configured to have a ring shape along the vicinity of the outer periphery of the O-ring seal surface 51.

Figure 4A:
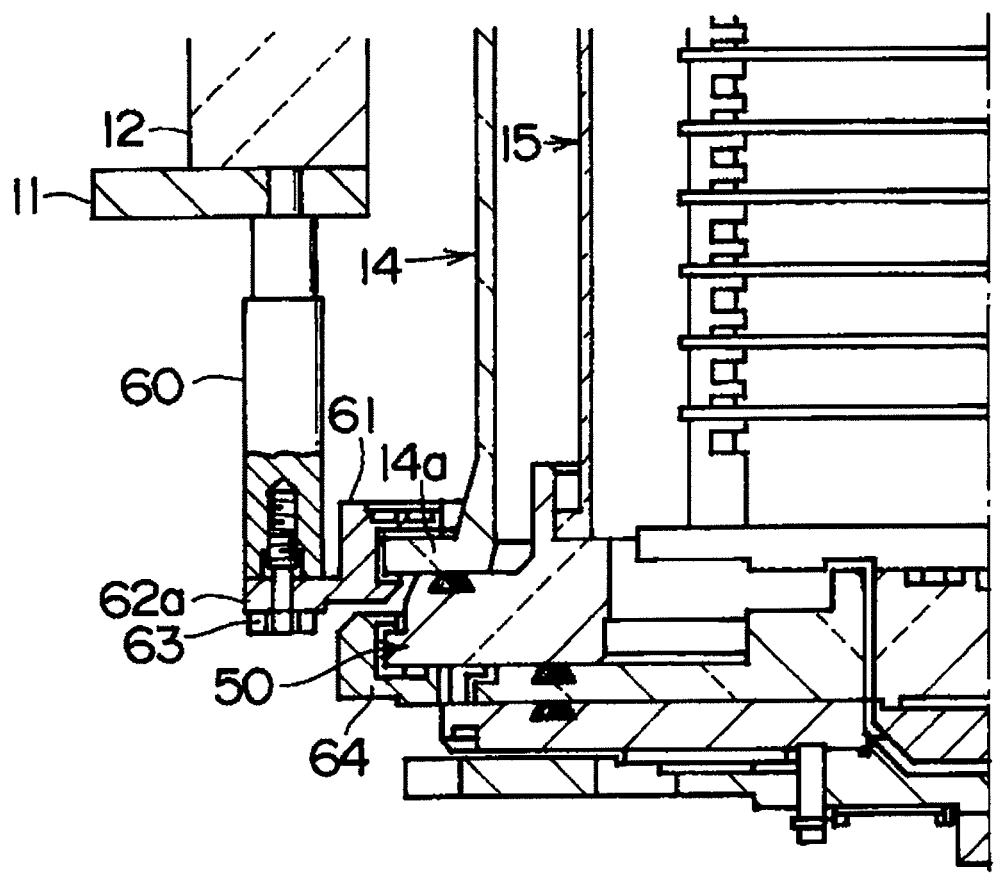
FIGS. 4A and 4B are sectional views taken along lines a-a and b-b of FIG. 3, respectively.

As shown in FIG. 3, at the outside of the outer tube 14, vertically extending three posts 60 are arranged in a circumferential direction at predetermined intervals, preferably, regular intervals. As shown in FIG. 4A, upper ends of the post 60 are fixed to the heater base 11.

The outer tube receiving part (first supporting member) 61 is suspended by the three posts 60. In detail, three brackets 62a are protruded along the outer circumference of the outer tube receiving part 61 at predetermined intervals, preferably, regular intervals, and the three brackets 62a are coupled to bottom surfaces of the three posts 60 by using bolts (coupling members) 63.

The outer tube receiving part 61 has a ring shape corresponding to a flange part 14a formed at the lower end of the outer tube 14. The outer tube receiving part 61 is mounted on the outer circumference of the flange part 14a. Therefore, the outer tube receiving part 61 can support the outer tube 14.

As shown in FIG. 3, in addition to the brackets 62a (hereinafter, referred to as first brackets) formed for the posts 60, six brackets 62b (hereinafter, referred to as second brackets) are protruded and arranged along the outer circumference of the outer tube receiving part 61 at predetermined intervals, preferably, regular intervals.

Figure 4B:
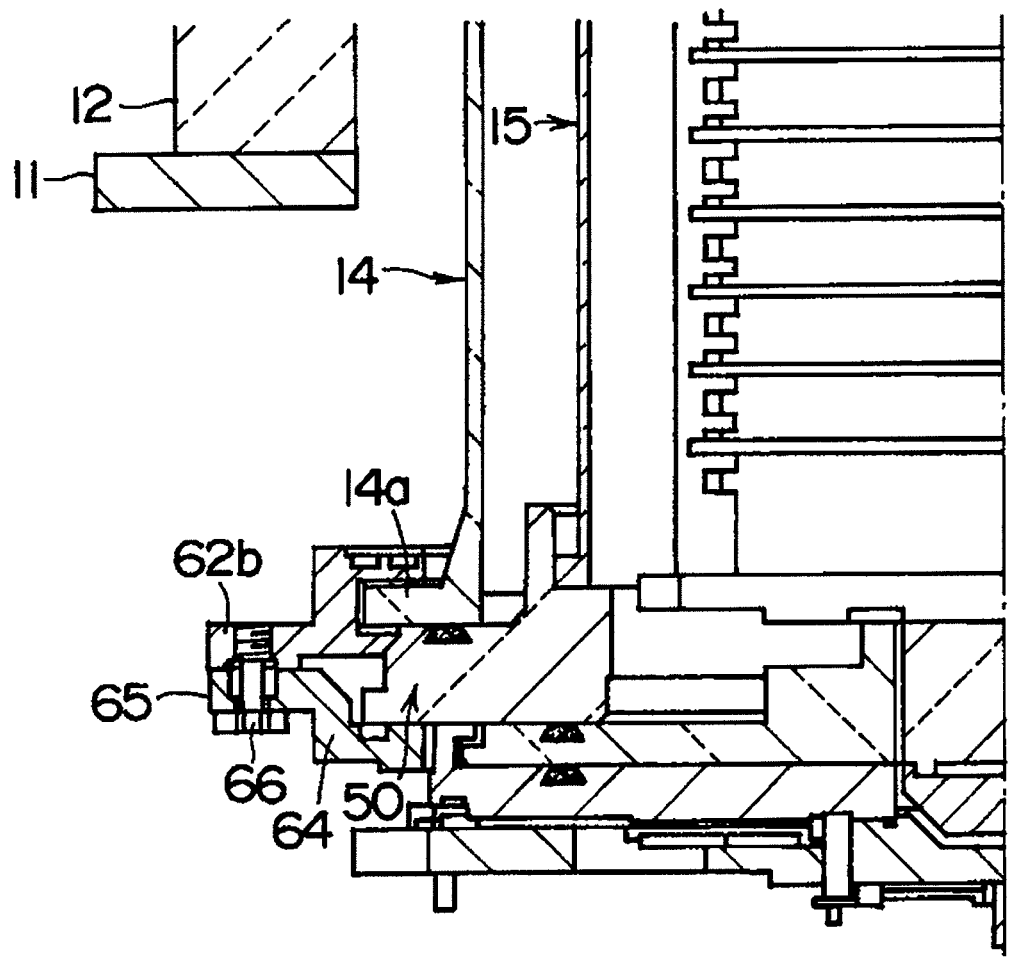

As shown in FIG. 4B, a manifold receiving part (second supporting member) is suspended by the second six brackets 62b. In detail, six brackets 65 are protruded along the outer circumference of the manifold receiving part 64 at predetermined intervals, preferably, regular intervals, and the six brackets 65 are coupled to bottom surfaces of the second six brackets 62b by using bolts (coupling members) 66.

The manifold receiving part 64 has a ring shape corresponding to the shape of the manifold 50. The manifold receiving part 64 is mounted on the outer circumference of the manifold 50. Therefore, the manifold 50 can be supported by the manifold receiving part 64. The inner tube 15 is supported by the manifold 50 so that the inner tube 15 is also supported by the manifold receiving part 64.

The posts 60 fixed to the heater base 11 are used to support both the outer tube receiving part 61 and the manifold receiving part 64 so that the CVD apparatus 10 can have a compact structure.

After separating the outer tube receiving part 61 from the posts 61, the outer tube 14, the manifold 50, and the inner tube 15 can be detached together. Therefore, the outer tube 14, the manifold 50, and the inner tube 15 can be easily replaced.

In addition, it is preferable that the outer tube receiving part 61 and the manifold receiving part 64 be supported at a plurality of positions arranged at regular intervals along a circumferential direction so as to uniformly distribute and support the weights of the outer tube 14, the manifold 50, and the inner tube 15. Thus, the O-rings 30a, 31a, and 53 can provide reliable sealing.

Next, in an IC manufacturing method, a film-forming process using the above-described CVD apparatus 10 will be explained in accordance with an embodiment of the present invention.

In the following description, each part of the CVD apparatus 10 is controlled by the controller 46.

After a plurality of wafers 1 are charged in the boat 37, the boat 37 is lifted and loaded into the process chamber 16 by the boat elevator 40 as shown in FIG. 1.

In this state, the seal cap 30 seals the bottom of the manifold 50 via the O-ring 30a, the seal cap cover 31, and the O-ring 31a.

The inside of the process chamber 16 is exhausted to a desired pressure (vacuum degree) by the exhaust device 23. At this time, the pressure inside the process chamber 16 is measured using the pressure sensor 21, and the pressure adjusting device 22 is feedback-controlled based on the measured pressure.

In addition, the heater 12 is operated to heat the inside of the process chamber 16 to a desired temperature. At this time, to obtain desired temperature distribution inside the process chamber 16, power to the heater 12 is feedback-controlled based on temperature information detected by the temperature sensor 43.

Next, the rotation mechanism 33 rotates the boat 37 to rotate the wafers 1 charged in the boat 37.

Gas supplied from the gas supply source 28 is controlled to a desired flow rate by the MFC 27 and is directed to the gas supply pipe 26 where the gas is introduced into the process chamber 16 through the gas supply unit 25.

The introduced gas flows upward inside the process chamber 16 and is discharged through the opened top of the inner tube 15 to the cylindrical space 17 where the gas is exhausted through the exhaust pipe 20.

When the gas passes through the inside of the process chamber 16, the gas makes contact with surfaces of the wafers 1 so that thin films can be deposited on the surfaces of the wafers 1 by thermal CVD reaction.

After a predetermined process time, inert gas is supplied from the gas supply source 28 to replace the inside atmosphere of the process chamber 16 with inert gas and return the pressure inside the process chamber 16 to atmospheric pressure.

Thereafter, the boat elevator 40 moves the seal cap 30 downward to open the bottom of the process chamber 16 and unload the boat 37 charged with the processed wafers 1 from the process chamber 16.

Then, the processed wafers 1 are discharged from the boat 37.

The present invention is not limited to the above-described embodiments, and various changes in form and details may be made in the embodiments without departing from the spirit and scope of the present invention.

For example, the material that can be used for making the manifold is not limited to quartz. That is, the manifold can be made of other materials such as alumina.

However, alumina can be readily cracked by temperature changes because the alumina is not resistant to a rapid temperature change. For example, a manifold made of alumina may be cracked when the temperature of a furnace varies from 700° C. by 100° C. or more.

Therefore, it is preferable that the manifold be made of quartz.

For example, the slope part 20a may be not formed at the exhaust pipe 20 although the height of the process vessel 18 excluding the heating area cannot be reduced.

For example, the seal cap cover may be not used although it may be difficult to suppress metallic contamination from the seal cap.

In the above-described embodiments, a CVD apparatus is explained; however, the present invention is not limited to the CVD apparatus. That is, the present invention may be applied to various substrate processing apparatuses such as a heat treatment apparatus configured to perform a heat treatment process such as film forming, annealing, oxidation, diffusion, and reflow treatment processes.

Substrates that can be processed according to the present invention are not limited wafers. Examples of such substrates include a photomask or printed circuit substrate, a liquid crystal panel, an optical disk, and a magnetic disk.

According to the present invention, when a quartz part such as the manifold, the outer tube, and the seal cap is placed on a floor, the O-ring seal surface can be protected, application of a weight to the exhaust pipe can be prevented, the possibility of damages of the quartz part and breakage of the exhaust pipe can be reduced, and permeation of contaminants from a floor into the furnace during a maintenance work can be prevented.

(Supplementary Note)

The present invention also includes the following preferable embodiments.

(Supplementary Note 1)

According to a preferred embodiment of the present invention, there is provided a substrate processing apparatus including: a reaction tube including an inner tube made of quartz and an outer tube made of quartz; a first joining surface configured to air-tightly join the outer tube and a manifold made of quartz; a second joining surface configured to air-tightly join the manifold and a seal cover made of quartz; and a third joining surface configured to air-tightly join the seal cover and a seal cap, wherein an O-ring is installed at least one of the first, second, and third joining surfaces, and a protrusion is installed outside the O-ring installed at the jointing surface.

(Supplementary Note 2)

In the substrate processing apparatus of Supplementary Note 1, the outer tube comprises an exhaust pipe, and a lowermost part of the protrusion is lower than a lowermost part of the exhaust pipe.

What is claimed is:

1. A substrate processing apparatus comprising:
a reaction tube comprising an inner tube and an outer tube;
a manifold disposed under the outer tube, a top surface of the manifold being in air-tight contact with a bottom surface of the outer tube via a sealing member;
a seal cap cover disposed under the manifold, a top surface of the seal cap cover being in air-tight contact with a bottom surface of the manifold via a sealing member;
a seal cap covered by the seal cap cover, a top surface of the seal cap being in air-tight contact with a bottom surface of the seal cap cover via a sealing member; and
at least one protrusion disposed at one of the bottom surface of the outer tube, the bottom surface of the manifold, the bottom surface of the seal cap cover and combinations thereof, wherein the protrusion at the bottom surface of the outer tube is disposed outside the sealing member between the top surface of the manifold and the bottom surface of the outer tube, the protrusion at the bottom surface of the manifold is disposed outside the sealing member between the top surface of the seal cap cover and the bottom surface of the manifold, and the protrusion at the bottom surface of seal cap cover is disposed outside the sealing member between the top surface of the seal cap and the bottom surface of the seal cap cover.

2. The substrate processing apparatus of claim 1, wherein the outer tube comprises an exhaust pipe having a flange, and a bottom surface of the protrusion at the bottom surface of the outer tube is lower than a lowermost part of the flange.

3. The substrate processing apparatus of claim 1, wherein the at least one protrusion disposed at the bottom surface of the outer tube has a ring shape.

4. A substrate processing apparatus comprising:
a reaction tube comprising an inner tube and an outer tube;
a manifold disposed under the outer tube, a top surface of the manifold being in air-tight contact with a bottom surface of the outer tube via a sealing member; and
a protrusion disposed at a bottom surface of a flange part of the outer tube, the protrusion being disposed outside the sealing member between the top surface of the manifold and the bottom surface of the outer tube and protruding downward from the bottom surface of the flange part.

5. A reaction tube comprising:
an inner tube and an outer tube;
a manifold disposed under the outer tube, a top surface of the manifold being in air-tight contact with a bottom surface of the outer tube via a sealing member; and
a protrusion disposed at a bottom surface of a flange part of the outer tube, the protrusion being disposed outside the sealing member between the top surface of the manifold and the bottom surface of the outer tube and protruding downward from the bottom surface of the flange part.

6. The substrate processing apparatus of claim 4,
wherein the outer tube comprises an exhaust pipe having a flange, and
wherein a bottom surface of the protrusion at the bottom surface of the outer tube is lower than a lowermost part of the flange.

7. The reaction tube of claim 5,
wherein the outer tube comprises an exhaust pipe having a flange, and
wherein a bottom surface of the protrusion at the bottom surface of the outer tube is lower than a lowermost part of the flange.

8. The reaction tube of claim 5, wherein the protrusion has a ring shape.

* * * * *